United States Patent [19]

Okamoto et al.

[11] Patent Number: 4,531,107
[45] Date of Patent: Jul. 23, 1985

[54] ACOUSTIC SURFACE WAVE DEVICE

[75] Inventors: Takeshi Okamoto; Shoichi Minagawa; Teruo Niitsuma, all of Tokyo, Japan

[73] Assignee: Clarion Co., Ltd., Tokyo, Japan

[21] Appl. No.: 511,500

[22] Filed: Jul. 6, 1983

[30] Foreign Application Priority Data

Jul. 6, 1982 [JP] Japan ................................ 57-118059

[51] Int. Cl.³ .................... H03H 9/145; H03H 9/64
[52] U.S. Cl. .................................. 333/194; 333/149; 333/196
[58] Field of Search ............................ 333/150-155, 333/193-196; 310/313 R, 313 A, 313 B, 313 C, 313 D

[56] References Cited

U.S. PATENT DOCUMENTS 3,750,027 7/1973 Hartmann ...................... 333/193 X
3,828,283 8/1974 Daniel ................................ 333/154
4,363,990 12/1982 Yamazaki et al. ............. 333/154 X

OTHER PUBLICATIONS

Matthews—"Surface Wave Filters", John Wiley and Sons, New York, 1977; pp. 120-123, 350-353.
Shimizu et al.—"Unidirectional Surface-Acoustic-Wave Transducers with AznO Film on a Glass Substrate", Electronics Letters, Jun. 23, 1977, vol. 13, No. 13, p. 384.
Claiborne et al.—"Low Loss Filters Using Unidirectional Transducer Technology", Conference: Proceedings of the 1979 International Symposium on Circuits and Systems, Tokyo, Japan, Jul. 17-19, 1979; pp. 609-612.
Toda et al.—"Lamb-Wave Device with Three Operation Modes", Electronics Letters, Nov. 23, 1978, vol. 14, No. 24; pp. 747-748.

Primary Examiner—Marvin L. Nussbaum
Attorney, Agent, or Firm—Stephen R. Arnold; Russell E. Hattis

[57] ABSTRACT

Acoustic surface wave device comprising a lower electrode disposed on an elastic substrate and an upper electrode consisting of two comb-shaped electrodes disposed apart from each other, opposite to said lower electrode through a piezoelectric film covering said lower electrode, at least one of said lower and upper electrodes being constructed as an apodized electrode.

10 Claims, 11 Drawing Figures

ACOUSTIC SURFACE WAVE DEVICE

BACKGROUND OF THE INVENTION

1. Field of the Invention

This invention relates to an acoustic surface wave device, in which influences due to mechanically reflected acoustic surface waves are reduced.

2. Description of the Prior Art

An acoustic surface wave device is so constructed that electric signals are transformed into acoustic surface waves by a transducer formed on a piezoelectric substrate and that the acoustic surface waves propagate along the surface of the substrate, by using piezoelectric material, such as rock crystal, $LiNbO_3$ (lithium niobate), etc., piezoelectric ceramic material, or a piezoelectric thin film disposed on a non-piezoelectric substrate. Acoustic surface wave devices are utilized more and more widely as diverse electronic parts, particularly as filters.

FIG. 1 shows an example of an acoustic surface wave device used as a filter, in which 1 denotes a piezoelectric substrate; 2 represents an input transducer consisting of a pair of comb-shaped electrodes 2A and 2B engaging with each other; and 3 represents an output transducer consisting of a pair of comb-shaped electrodes 3A and 3B engaging with each other. The device is so constructed that electric signals coming from a signal source 4 and applied to the input transducer 2 are transformed into acoustic surface waves, which propagate along the surface of the piezoelectric substrate 1, and after having reached the output transducer 3, are transformed again into electric signals and output from a load 5.

The width W of each member electrode of the comb-shaped electrodes and the distance L between two adjacent member electrodes belonging to different comb-shaped electrodes 2A, 2B or 3A, 3B forming the input or output transducer 2, 3 are equal to a predetermined value $\lambda_0/4$, where $\lambda_0$ is the wavelength of the center frequency $f_0$ of used acoustic surface waves, i.e. the electrodes are formed as normal type electrodes.

A filter provided with transducers consisting of normal type electrodes, as indicated in FIG. 1, has a disadvantage that ripple-like variations in frequency characteristics are inevitable, because there are provoked considerable mechanically reflected waves due to the fact that acoustic surface waves reflected by the extremity of the member electrodes are in phase.

In order to reduce such influences due to reflected waves, a double electrode type transducer shown in FIG. 2 has been proposed. This structure is so designed that each finger-shaped member electrode of the parts of the comb-shaped electrodes 2A, 2B and 3A, 3B is divided into two parts. Owing to this arrangement, the phase of the waves reflected by the extremity of one of the two parts differs by 180° from the phase for the other so that they are compensated by each other and influences due to the reflected waves are diminished.

However, considering that the frequency in recent surface wave devices tends to increase more and more, and hence the wavelength $\lambda_0$ becomes more and more smaller with increasing frequency, high precision is required for fabrication techniques for the comb-shaped electrodes. For example, using lithium niobate, which is used most widely as peizoelectric substance, and a center frequency of 1 GHz, then $\lambda_0/4 = 0.87$ μm, $\lambda_0/8 = 0.44$ μm. These distances are difficult to realize with a good reproducibility, even by using the newest microfabrication techniques, and it is inevitable that production yield is lowered.

In order to remove these inconveniences, further single phase type transducers, as shown in FIGS. 3(a) and (b), have been proposed. These transducers are constructed using an elastic substrate 6 and a piezoelectric film 7 disposed thereon as a piezoelectric substrate 1, a lower electrode 8 being disposed on said elastic substrate 1 so that the comb-shaped electrodes 9A and 9B, for which the width of each of the member electrodes and the distance between them are equal to $\lambda_0/2$, are disposed on the piezoelectric film 7 opposite to the lower electrode 8.

According to this construction, when a signal source 4 is connected between the upper electrode 9A and the lower electrode 8, which is earthed, stress is produced by an electric field due to a voltage applied to the upper electrode. Acoustic surface waves are thus excited and propagate along the direction indicated by the arrow. Since the width of each of the member electrodes belonging to only one comb-shaped electrode and the distance L between them are equal to $\lambda_0/2$, requirements on the precision in fabrication techniques are alleviated, and it becomes possible to increase the production yield.

However, this structure is a so-called unbalanced power supply type, in which signal potential is applied to the upper electrode with respect to the lower electrode 8 at earth potential.

Due to this fact, so-called field feed through phenomena are provoked, by which electric input signals are not transformed into elastic surface waves, but transmitted as direct waves. Consequently, in this device, signals due to field feed through phenomena exist together with signals due to acoustic surface waves between the output electrode 9B and the lower electrode 8. The device has, therefore, a disadvantage that its transmission characteristics as a filter are worsened.

SUMMARY OF THE INVENTION

An object of this invention is to reduce influences due to acoustic surface waves reflected mechanically and field feed through phenomena in an acoustic surface wave device.

Another object of this invention is to facilitate the fabrication of an acoustic surface wave device by enabling the utilization of comb-shaped electrodes having a relatively large electrode width even for high frequency regions.

In order to achieve these objects, an acoustic surface wave device according to this invention is so constructed that a lower electrode is disposed on an elastic substrate; an upper electrode is disposed on a piezoelectric substrate consisting of said elastic substrate and a piezoelectric film disposed thereon; and at least one of said lower and upper electrodes is formed as an apodized (optimized geometry) electrode.

Hereinbelow this invention will be described more in detail, referring to some embodiments shown in the drawing.

DETAILED DESCRIPTION OF PREFERRED EMBODIMENTS

Figure 1:
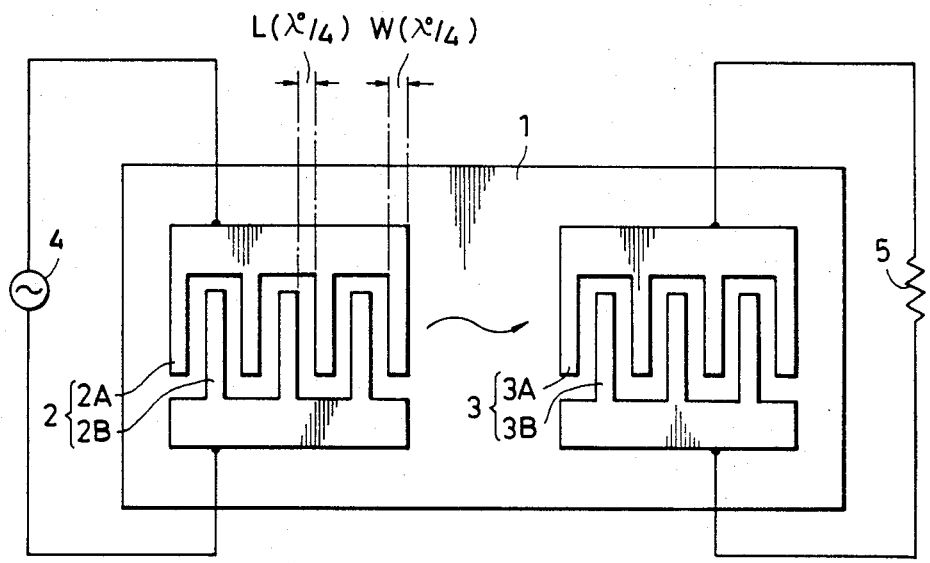
FIG. 1 is a plan view of a prior art acoustic surface wave device.
Figure 2:
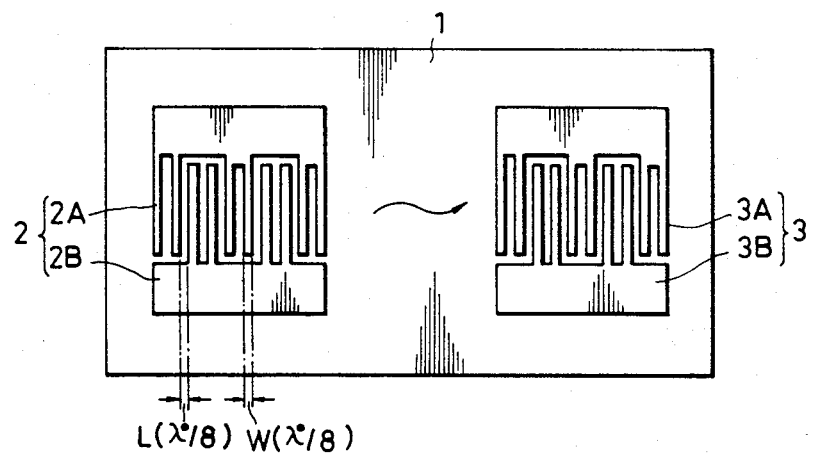
FIG. 2 is a plan view of another prior art acoustic surface wave device.
Figure 3A:
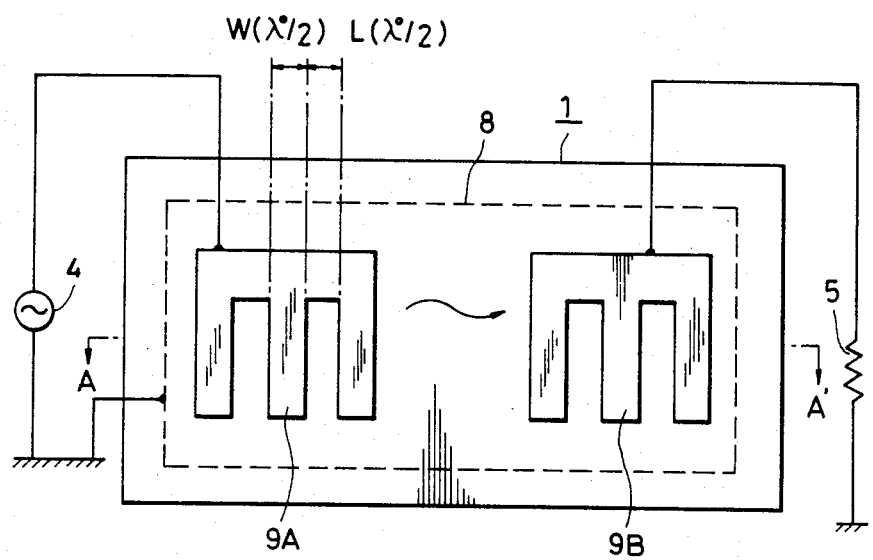
FIGS. 3(a) and 3(b) are a plan view and a cross sectional view, respectively, of a still other prior art acoustic surface wave device.
Figure 3B:
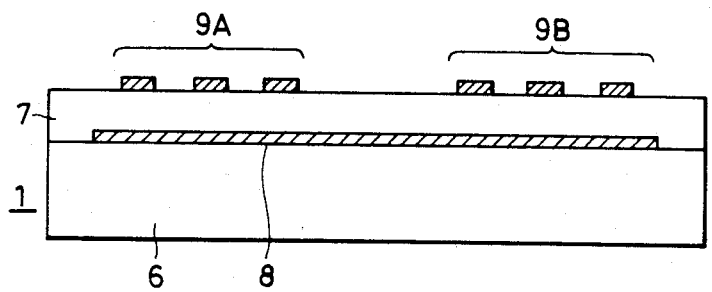
Figure 4:
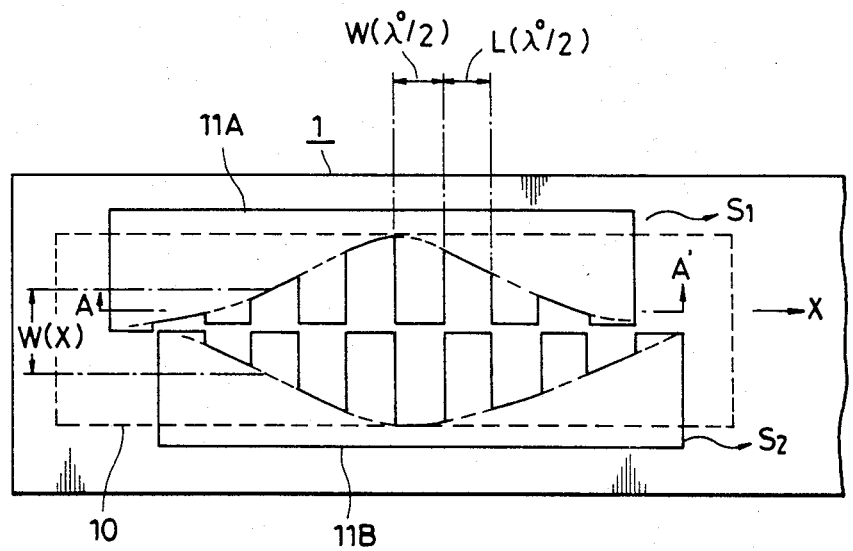
FIGS. 4(a) and 4(b) are a plan view and a cross sectional view, respectively, of an acoustic surface wave device according to this invention.
Figure 4:
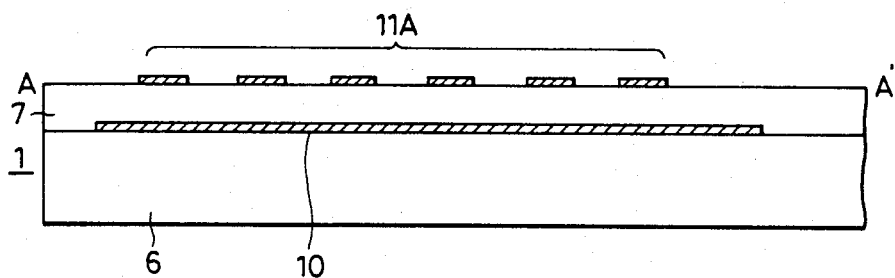

FIGS. 4(a) and 4(b) are a plan view and a cross sectional view, respectively, of the input transducer portion of an acoustic surface wave device according to this invention. A piezoelectric substrate 1 consists of an elastic substrate 6 and a piezoelectric film 7 disposed between thereon. A lower electrode 10 consists of a rectangular electrode disposed on the elastic substrate 6 and an upper electrode 11 consists of two comb-shaped electrodes 11A and 11B disposed on the piezoelectric film 7. Thus, a so-called single phase transducer is formed. The comb-shaped electrodes 11A and 11B are so disposed on the piezoelectric film 7 opposite to the lower electrode 10 that they are shifted by $\lambda_0/2$ from each other in the propagation direction of acoustic surface waves and that they are opposite to each other. The width of each of the member electrodes of the comb-shaped electrodes 11A and 11B and the distance L between them are so designed that both of them are equal to $\lambda_0/2$. Furthermore, the comb-shaped electrodes 11A and 11B, which are opposite to each other, are so formed that the effective length of the open spaces between two adjacent member electrodes varies according to a weighting function $\omega(X)$ in the X direction so that the member electrodes form an apodized (optimized) electrode. Therefore, the length of the member electrodes of the comb-shaped electrodes 11A and 11B variers along the propagation direction of produced acoustic surface waves according to the weighting function $\omega(X)$. This weighting function can be obtained by an inverse fourier transformation of desired frequency characteristics. The output transducer is so formed that it has also the same form as the input transducer described above.

In the above structure, when a signal source is connected to the input transducer in a form of balanced type excitation power supply, that is, the signal source is connected between the two comb-shaped electrodes forming an upper electrode and the lower electrode is earthed. Since an electric field is produced between said comb-shaped electrodes 11A, 11B and the lower electrode 10, acoustic surface waves $S_1$ and $S_2$ are excited and propagate along the X direction from each member electrode of the comb-shaped electrodes 11A and 11B forming the upper electrode.

In this case, since the member electrodes of the comb-shaped electrodes 11A and 11b are shifted by $\lambda_0/2$ to each other in the propagation direction X of the acoustic surface waves and the phase of the electric signals applied to the electrodes 11A and 11B is different by 180° from each other, the acoustic surface waves $S_1$ and $S_2$ are in phase.

In the above described embodiment, the lower electrode 10 is formed in the form of a large rectangle. However, the same effects can be obtained if the lower electrode extends only in a region through the piezoelectric film 7 opposite to the region where it is desired to produce acoustic surface waves, that is, to the region surrounded by the weighting function envelope $\omega(X)$.

Figure 5:
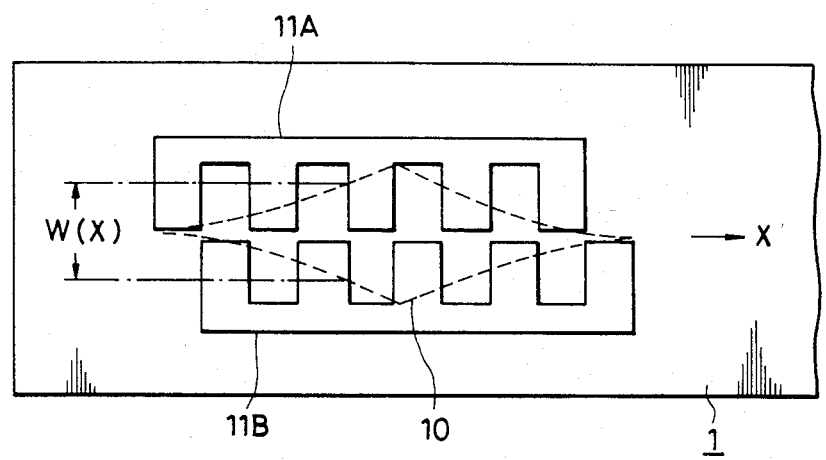
FIGS. 5 to 8 are plan views of different acoustic surface wave devices according to this invention.

Thus, as shown in FIG. 5, it is possible to weight the region where the acoustic surface waves are produced by using two comb-shaped electrodes 11A and 11B having a usual form and by forming the lower electrode 10 as an apodized electrode.

Figure 6:
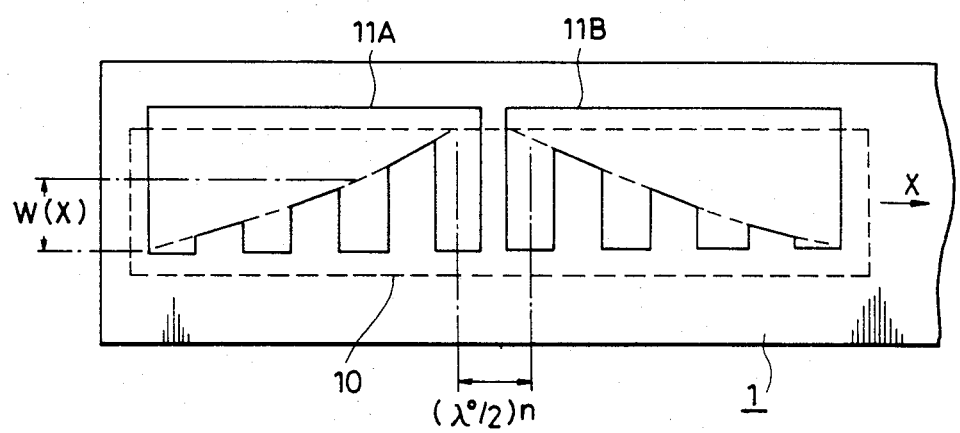

FIG. 6 shows another embodiment, where the comb-shaped electrodes are so arranged on a line that they are apart from each other by $\lambda_0/2$ multiplied by an integer in the propagation direction X so that they form an apodized electrode structure.

Figure 7:
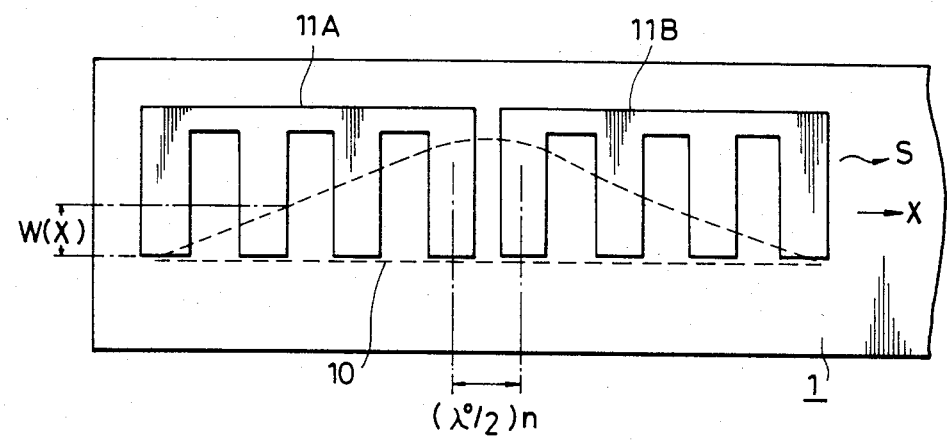

FIG. 7 shows still another embodiment, where the lower electrode 10 is formed as an apodized electrode and disposed through the piezoelectric film 7 opposite to the comb-shaped electrodes 11A and 11B arranged on a line.

For the structures, as shown in FIGS. 6 and 7, where the comb-shaped electrodes 11A and 11B are arranged on a line, the comb-shaped electrodes excite acoustic surface waves S in phase, which propagate in the X direction.

In the structures of the above described embodiments, since the width W of each of the member electrodes of the comb-shaped electrodes 11A and 11B and the distance L between them are equal to $\lambda_0/2$, they are 2 or 4 times as large as the corresponding values of the prior art normal type or double type electrodes. Therefore, requirements on the precision of fabrication techniques can be alleviated and production yield can be increased.

Figure 8:
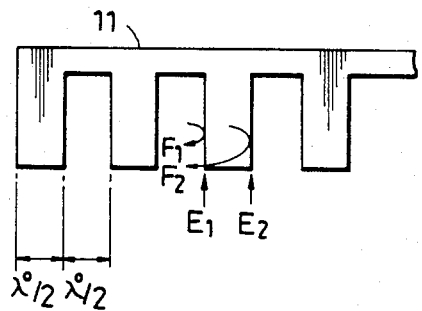

By choosing the distance $\lambda_0/2$ between two adjacent member electrodes, as mentioned above, reflected waves $F_1$ and $F_2$ produced at the extremity of each of the member electrodes $E_1$ and $E_2$, as indicated in FIG. 8, have a phase difference of 180° so that they are in opposite phase. Therefore, they can be compensated by each other. As a result, influences of reflections between member electrodes can be reduced and ripple-like variations in frequency characteristics can be also decreased.

Figure 9:
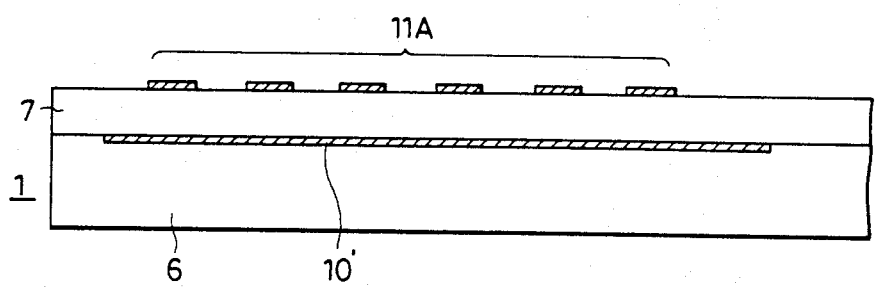
FIG. 9 is a cross sectional view of an acoustic surface wave device according to another embodiment of this invention, which can be common to the devices shown in FIGS. 4(a), and 5 to 8.

Further, a semiconductor material can be used as an elastic substrate 6 mentioned above, as indicated in FIG. 9. In this case, a low resistance portion 10' can be formed by doping a predetermined portion of the semiconductor substrate with a suitable impurity, which portion can be used as a lower electrode. Therefore, another conductive material serving as a lower electrode is not necessary. In this way, using a semiconductor substrate, it is possible to mount surface wave devices and integrated electronic circuits in one body. Thus, applications of the surface wave device in widely varrying domains become possible.

The above mentioned piezoelectric film 7 of zinc oxide (ZnO), aluminum nitride (AlN), etc. may be formed by well known sputtering method, chemical vapor deposition method and so forth.

As clearly understood from the above description, according to this invention, since the acoustic surface wave device comprises a lower electrode disposed on an elastic substrate and an upper electrode consisting of two comb-shaped electrodes disposed on a piezoelectric film covering said elastic substrate, and at least one of said lower and upper electrodes is constructed as an apodized electrode, it is possible to obtain the desired frequency characteristics as well as to reduce the influences of mechanically reflected acoustic surface waves and of field through phenomena. Furthermore, since the width of the member electrodes can be relatively large even for high frequency regions, the acoustic surface wave device according to this invention is easy to fabricate and permits to remove the inconveniences of the prior art devices.

We claim:

1. In an acoustic wave device for the production or sensing of a surface acoustical wave of a chosen frequency traveling in a given direction along a substrate, the improvement comprising:

an elastic substrate;

a lower electrode disposed on said elastic substrate;

a piezoelectric film disposed so as to cover said lower electrode; and an upper electrode structure including at least two comb-shaped electrodes disposed spaced apart from each other on said piezoelectric film and generally confronting said lower electrode, each of said electrodes including a plurality of electrically conducting and electrically interconnected parallel fingers disposed transversely to said direction of propagation, the lengths of said fingers and the configuration of said lower electrode being adjusted so that the areas of confrontation between said lower electrode and the fingers of said electrodes varies among said fingers to produce a chosen frequency response characteristic, said two electrodes being disposed so that the fingers of one do not interdigitatingly overlap the fingers of the other.

2. The acoustic surface wave device of claim 1 wherein said fingers of one of the electrodes are disposed to extend generally towards said fingers of the other electrode in a generally confronting relationship.

3. Acoustic surface wave device according to claim 2, wherein said comb-shaped electrodes are so disposed opposite to each other that said comb-shaped electrodes are shifted with respect to each other along said propagation direction of acoustic surface waves by half of the wavelength for the chosen center frequency of said acoustic surface waves.

4. Acoustic surface wave device according to claim 2, wherein each of said comb-shaped electrodes consists of a plurality of member electrodes and the width of each of said member electrodes and the distance therebetween are equal to half of the wavelength for the chosen center frequency of said acoustic surface waves.

5. The acoustic surface wave device of claim 1 wherein said two electrodes are disposed offset along said direction of propagation in a side-by-side relationship having nonconfronting fingers, and wherein the distance between the fingers of said device is an integer multiple of one-half of the wavelength of the chosen center frequency of said acoustical waves.

6. Acoustic surface wave device according to claim 1, 3, 4, 2 or 5 further comprising means for applying to said electrodes of said upper electrode structure balanced electric signals with respect to said lower electrode.

7. Acoustic surface wave device according to claim 1, 3, 4, 2, or 5, wherein said elastic substrate is made of a semiconductor material.

8. Acoustic surface wave device, according to claim 1, 3, 4, 2, or 5, wherein said elastic substrate is made of a semiconductor material, and a low resistance region is formed in a surface portion of said elastic substrate made of a semiconductor material, said low resistance region serving as said lower electrode.

9. The acoustic surface wave device of claims 1, 3, 4, 2, or 5 wherein said lower electrode is generally rectangular and the lengths of said fingers are varied from one to the next to provide said variation in confrontational area.

10. The acoustic surface wave device of claims 1, 3, 4, 2, or 5 wherein said fingers are of equal length and said lower electrode is configured to provide said variation in confrontational area.

* * * * *